United States Patent [19]

Kolbe et al.

[11] 4,397,543

[45] Aug. 9, 1983

[54] MASK FOR IMAGING A PATTERN OF A PHOTORESIST LAYER, METHOD OF MAKING SAID MASK, AND USE THEREOF IN A PHOTOLITHOGRAPHIC PROCESS

[75] Inventors: Hartmut F. Kolbe, Boeblingen; Frank A. Schwarzbach, Hildrizhausen, both of Fed. Rep. of Germany

[73] Assignee: International Business Machines Corporation, Armonk, N.Y.

[21] Appl. No.: 299,703

[22] Filed: Sep. 8, 1981

[30] Foreign Application Priority Data

Dec. 29, 1980 [EP]  European Pat. Off. ........ 80 108233.0

[51] Int. Cl.$^3$ ..................... G03B 27/52; G03B 27/32
[52] U.S. Cl. ........................................ 355/40; 355/53; 355/77; 430/22; 430/312
[58] Field of Search ................. 355/77, 132, 40–44, 355/53, 54, 75, 125, 79; 430/22, 312, 321

[56] References Cited

U.S. PATENT DOCUMENTS 3,507,592  4/1970  McLaughlin .................. 355/125 X
4,094,602  6/1978  Holliday .......................... 355/53 X Primary Examiner—Richard A. Wintercorn
Attorney, Agent, or Firm—John J. Goodwin

[57] ABSTRACT

The invention relates to a mask for imaging a pattern on a photoresist layer, with at least one alignment mark, to a method of making such a mask, and use of these masks for making semiconductor components.

The masks made in accordance with the invention are obtained in such manner that in their production the patterns of adjacent chip fields are imaged to the effect that they overlap in their border lines containing the alignment marks. The process produces alignment marks representing the mean of at least two alignment marks of adjacent chip fields.

By means of the above specified manufacturing process, the opto-mechanical imaging defects observed during mask production can be substantially eliminated. The masks as disclosed by the invention can be aligned in semiconductor processes with more precision than prior art masks.

10 Claims, 4 Drawing Figures

MASK FOR IMAGING A PATTERN OF A PHOTORESIST LAYER, METHOD OF MAKING SAID MASK, AND USE THEREOF IN A PHOTOLITHOGRAPHIC PROCESS

DESCRIPTION

1. Field of the Invention

The invention relates to a mask for imaging a pattern on a photoresist layer with at least one alignment mark, to a method of making said mask, and to the use of masks of that type in a photolithographic process.

2. Prior Art

The complexity of integrated circuits has grown exponentially in the past. Starting from discrete devices, integrated circuits with small, medium, and large-scale circuit density, and finally integrated circuits with very-large-scale circuit density (VLSI's) with up to 100,000 transistors per chip have been made. This complexity of the circuits comprises many manufacturing problems to be solved. An essential problem lies in the field of microlithography, i.e. the developing of methods for imaging these dense circuit designs on the substrate or on the wafer.

For making LSI circuits, masks normally consisting of a thin glass substrate with an even thinner chromium coating are used as tools. The chromium mask defines the desired circuit configurations of a layer to be made in a predetermined process step. To give an example: The mask defines an area that is to be etched out of the wafer. After all process steps have been completed, each one with its own mask, the wafers are sliced along the border lines, and the individual chips are fixed on substrates, so-called modules. The masks used in the individual process steps have to be made with maximum precision, for the semiconductor devices made therewith cannot be better than the tools (masks) used to make them.

In the conventional production of masks where the same pattern is repeated stepwise in accordance with the stepwise repetition of the chips, two chip locations provided on two opposite mask sides on the wafer are left out, and alignment masks are provided in the center of these chip locations. The disadvantage of this method is that the chip output is reduced by two chips per wafer, with the consequence of an overall yield reduction. Another method consisted in providing alignment marks in those mask areas which correspond to the border lines on the semiconductor wafer. However, these alignment marks are affected by the errors and distortions in mask production, and consequently the masks of the individual process steps in the desired structures cannot coincide sufficiently.

SUMMARY OF THE INVENTION

The object of the invention is to provide a mask, and a method of making this mask with alignment marks permitting a more precise mask alignment than with the former methods which involve incorrect alignment owing to the distortions during production.

The object of the invention is achieved by a mask with at least one alignment mark, which is characterized in that the alignment mark represents the mean of at least two alignment marks of adjacent chip fields.

Another object of the invention is a method of making such masks, and their use in a photolithographic process in the production of semiconductor components.

The alignment marks of the mask as disclosed by the invention are obtained by taking the mean of at least two alignment marks of adjacent chip fields, thus substantially excluding enlargement and distortion errors in the mask production. Alignment errors resulting from the stepwise table movement can be eliminated at least partly through taking the mean.

DESCRIPTION OF THE INVENTION

The invention will be described below in detail with reference to the figures and the specification.

The figures show the following:

Figure 1:
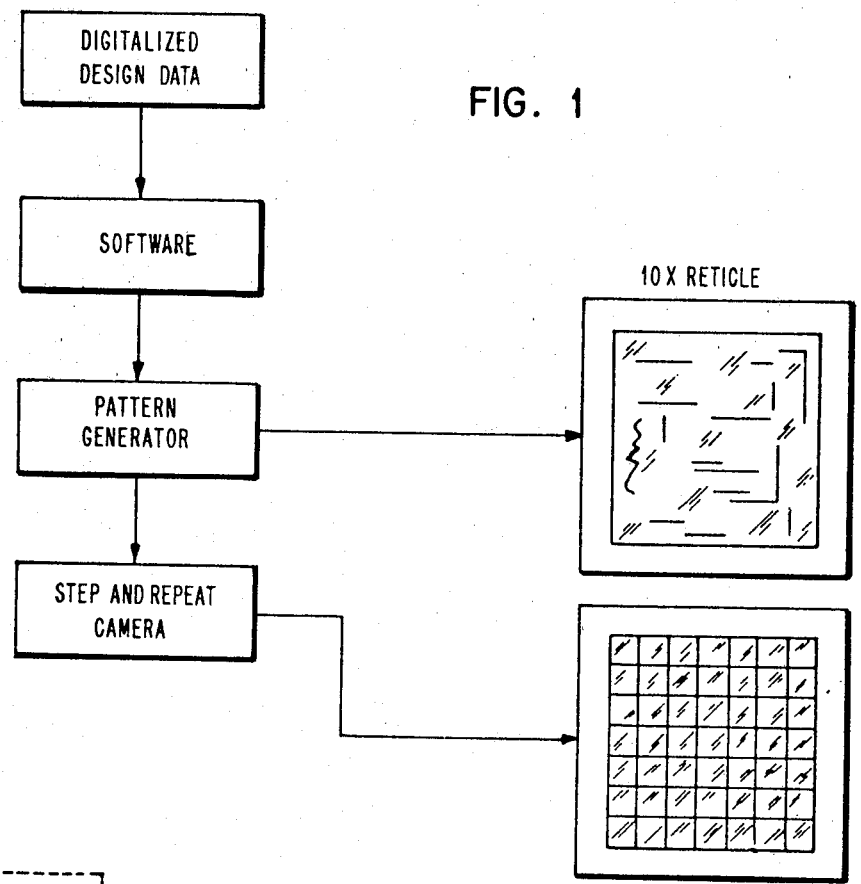
FIG. 1 is a flow chart for making the masks.

Following the conventional optical method of mask production shown in FIG. 1, a designer makes the design of the respective integrated circuit. By means of the software the digitalized design data are transformed into machine instructions. These program data are used to operate a device for pattern generation.

In this process, the reticle of at least one chip for one process step is made in a ten-fold enlargement. Since wafer exposure involves masks where this chip pattern is repeated stepwise, the reticle pattern is reproduced by means of the step and repeat camera. For that purpose, the reticle is aligned with precision. The camera images the reticle at a ratio of a 10:1 reduction on a photographic plate in a holder which is moved in X-direction at a constant speed. The path covered by this holder is determined by means of electrical pulses counted by a control unit. After a predetermined number of counted pulses, the reticle is projected onto the photographic plate. The same process is repeated periodically until one row of e.g., 10 exposures is terminated. The photographic plate then advances in Y-direction by one chip spacing, and the exposures of the next row in X-direction are made. The process is repeated until all exposures for making the 1× master mask have been executed. An important factor of this method is that the exposures of the individual fields on the mask corresponding to the chip fields on the wafer are effected in such a manner that the alignment marks arranged in each row of the chip fields in the area of the future border lines of the wafer are superimposed by the alignment marks of the adjacent row of chip fields. In the subsequent development of the thus exposed photoresist layer, alignment marks are formed representing the mean of marks of adjacent chip fields. The 1× master mask is completed in that the exposed plate is developed conventionally, and the chromium layer under the photoresist mask is etched.

Figure 2:
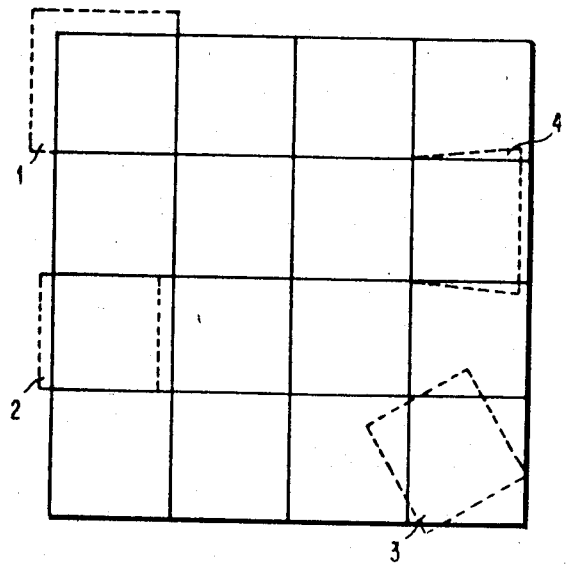
FIG. 2 is a section of a mask field with the essential mask errors.

FIG. 2 represents the most important opto-mechanical distortions of the mask possible in a manufacturing process with optical exposure, and which may cause a defective alignment between the individual masks of a mask set.

Mask defects are divided into irregularities in the chip field, and irregularities appearing from chip field to chip field. The former comprise defects in the production of the 10×-reticle, and defects originating from the alignment of this 10×-reticle on the master mask, and furthermore defects in the transfer at a ratio of 10:1 onto the master mask, e.g., owing to focusing influences etc.

The second group of irregularities from chip field to chip field comprises e.g., unprecise movements of table and table drive, with a distinction being made between errors of the first order, so-called stepping errors in X- and Y-direction, and errors of the second order where the 10×-reticle is not aligned precisely in parallel to the table movement, i.e., where there is a tilt to the optical plane.

Apart from the alignment errors in the photolithographic exposure system further mask defects can be caused by non-planar masks, temperature effects etc.

In FIG. 2, a defect is depicted under 1 which is caused by the reduction of the reticle at a ratio of 10:1 to the mask field (focusing influence). 4 represents a defect appearing at a non-parallel arrangement of the reticle relative to the table in the chip field. 3 shows the rotation of a chip field. As an example for the irregularities from chip field to chip field, 2 represents the lateral shift of a chip field caused by a stepping error. The representation does not include e.g., barrel and pin cushion distortions caused by a lens defect in the chip field, and keystone distortions in the mask owing to lack of parallelity between reticle and mask, and different thermic coefficients from mask to reticle. In the high quality masks that can be produced at present in accordance with prior art, defects in the chip field (1, 3, 4 in FIG. 2) are of approximately the same effect as defects of the table movement (2 in FIG. 2) observed in the production of the master mask through the copying of the 10× reticle.

It is known that there can be no further machine improvements in the field of precision mechanics. Mask production can thus be improved only by improvements in the photolithography area. The subject of the present invention is an improvement of the latter type. The method as disclosed by the invention for making a mask comprises a photochemical superposition of the chip fields to be imaged in the border line at the periphery of the individual fields, i.e., in an area containing the alignment marks. According to this method, defects of magnification, distortion and skew are eliminated, and alignment errors resulting from the stepwise table movement are eliminated at least partly through taking the mean.

Figure 3A:
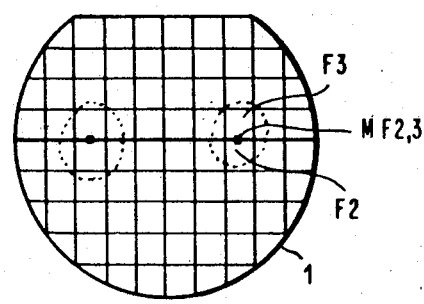
FIG. 3A is a mask where two alignment marks are arranged on the border line of two chips provided on opposite mask sides.
Figure 3B:
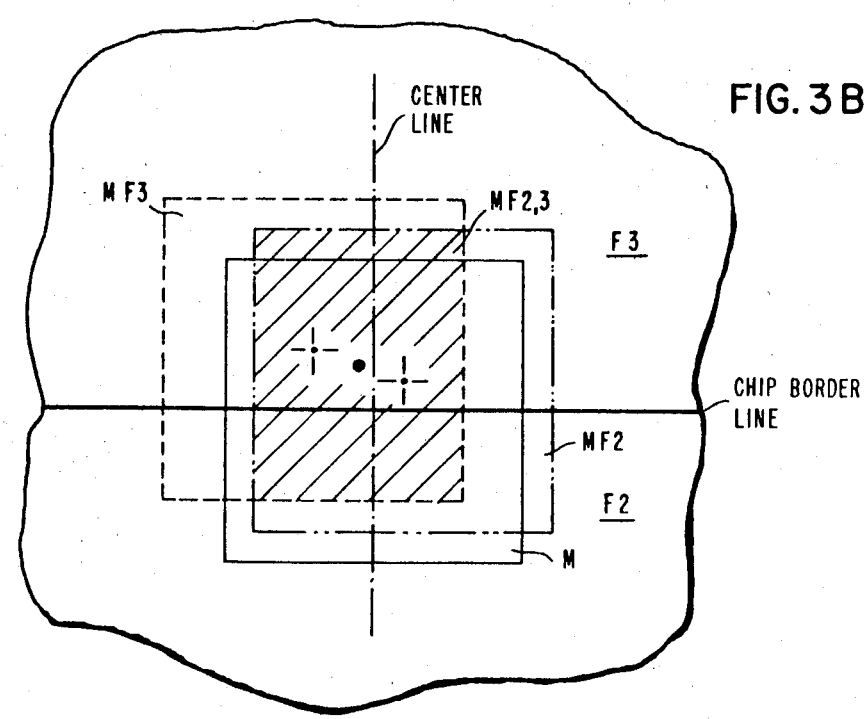
FIG. 3B is a section of two chip fields of FIG. 3A, with an alignment mark obtained from the mean of the two marks associated to the chip fields.

FIG. 3A shows a 1× master mask 1 where two adjacent chip fields F2 and F3 are marked with a frame. The alignment mark on the border line between these two fields which has been formed by taking the mean of the marks of fields 2 and 3 is marked MF2,3. FIG. 3B shows the forming of alignment mark MF2,3 by taking the mean of the marks of fields 2 and 3.

In FIG. 3B, the separating line shown there represents the border line between the two adjacent chip fields F2 and F3. Under ideal conditions, the center of alignment mark M formed by the superposition of the alignment marks of field F2 and F3, is positioned precisely on the point of intersection of the middle line of the chip fields with the border or separating line. In one actual case, alignment mark MF2 is shifted upward and slightly to the right, alignment mark MF3 is shifted upward and slightly to the left, according to the representation. The centers of both alignment marks are positioned to the left and right of the middle line in the drawing.

The shaded field in FIG. 3B which is marked MF2,3 and formed by superimposing the corresponding areas of alignment mark fields MF2 and MF3 is the alignment mark which is later available to the operator for aligning the mask on the semiconductor wafer. The center of this field is on the connecting line of the centers of fields MF2 and MF3, at the left of the FIGURE in the immediate vicinity of the middle line.

The arrangement of the alignment marks obtained by forming the mean as shown in FIGS. 3A and 3B, is the simplest embodiment. In that case, the alignment mark lies in the area of the point of intersection of the border or separating line with the middle line of the chip fields. However, the alignment marks can also be arranged in the chip field corners. In an arrangement of this type, an alignment mark is obtained through photochemical superposition which represents the mean of four alignment marks of adjacent chip fields. The four-fold superposition of the alignment marks permits a still better influence on the error components than with the superposition of two marks. Further embodiments of the invention with photochemical superposition of alignment marks are possible within the scope of the present invention.

With the method as disclosed by the present invention, it is possible to provide mask sets of improved alignment for semiconductor processes permitting a higher integration through improved structural superposition of the individual process steps. Owing to the higher precision with which the masks can be aligned, the amount of parasitic elements formed in the semiconductor process is smaller, and the product yield and reliability of the integrated circuits is increased.

Having thus described our invention, what we claim as new, and desire to secure by Letters Patent is:

1. Mask for imaging a pattern on a photoresist layer disposed on a semiconductor wafer having border lines separating chip fields, said mask including at least one alignment mark arranged in that mask area corresponding to said border lines on said semiconductor wafer, characterized in that the said at least one alignment mark represents the mean of at least two alignment marks of adjacent mask areas, said mean being the area formed by the one portion of adjacent alignment mark superimposed on a portion of at least one other adjacent alignment mark.

2. Mask as claimed in claim 1, characterized in that the alignment mark is arranged in that area of the mask which corresponds to the border lines on the semiconductor wafer.

3. Mask according to claim 1 characterized in that the said alignment mark is arranged in the area of the point of intersection of the border line with the middle line of the said chip fields.

4. Mask according to claim 1 characterized in that the alignment mark is arranged in the area of the border lines in the corners of the said individual chip fields.

5. Mask according to claim 1 characterized in that said mask consists of a multitude of identical chip fields.

6. Mask according to claim 1 characterized in that said masks consists of chromium.

7. Method of making a mask for imaging a pattern on a photoresist layer with at least one alignment mask, characterized in that a reticle with the patterns of the respective chip field and of the alignment mark is periodically imaged with an n-fold reduction on a glass plate with a chromium and a photoresist layer, that the photoresist layer is developed, and the chromium layer is etched through the photoresist mask.

8. Method as claimed in claim 7, characterized in that the photochemical exposure of the recticle is effected in such a manner that the alignment marks of the one row of chip fields are superimposed by the alignment marks of the following row of chip fields, and that alignment marks are formed as a mean of at least two exposures.

9. Method as claimed in claim 7 characterized in that the alignment marks are imaged in that area of the mask which corresponds to the border line on the semiconductor wafer.

10. Use of masks with alignment marks made in accordance with claim 7, in a photolithographic process for making semiconductor components.

* * * * *